United States Patent [19]

Ohno

[11] Patent Number: 4,666,078
[45] Date of Patent: May 19, 1987

[54] ELECTROLESS PLATED TERMINALS OF DISPLAY PANEL

[75] Inventor: Yoshihiro Ohno, Suwa, Japan

[73] Assignee: Seiko Epson Kabushiki Kaisha, Tokyo, Japan

[21] Appl. No.: 827,211

[22] Filed: Feb. 4, 1986

Related U.S. Application Data

[63] Continuation of Ser. No. 486,607, Apr. 19, 1983, abandoned.

[30] Foreign Application Priority Data

Apr. 20, 1982 [JP] Japan .................................. 57-65691
Apr. 21, 1982 [JP] Japan .................................. 57-67023

[51] Int. Cl.$^4$ .......................... H05B 43/00; H01J 1/53
[52] U.S. Cl. ..................................... 228/124; 350/332; 445/24
[58] Field of Search .................... 445/24, 25; 228/123, 228/124; 427/92, 98, 126.2; 350/332

[56] References Cited

U.S. PATENT DOCUMENTS 3,671,311  6/1972  Tarnopol et al. ...................... 427/98
4,029,393  6/1977  Dungan et al. .................. 350/331 R
4,422,731 12/1983  Droguet et al. ....................... 445/24

OTHER PUBLICATIONS

Schmeekenbeeher *IBM Technical Disclosure Bulletin* vol. 18, No. 7, p. 2167 (12-1975).
Shang *IBM Technical Disclosure Bulletin* vol. 22, No. 5, p. 1801 (10-1979).
Tanner et al., "An All-Plated, Low Cost Contact System for Silicon Solar Cells" IEEE Photovoltaic Specialists Conference Papers, pp. 800-804 Jan. 1980.

*Primary Examiner*—Kenneth J. Ramsey
*Attorney, Agent, or Firm*—Blum Kaplan

[57] ABSTRACT

A display panel includes a transparent substrate, a transparent conductive, patterned metallic oxide layer including terminals disposed thereon, an electroless plated metal layer on the terminals and an electroless plated solder layer on the metal layer.

22 Claims, 2 Drawing Figures

FIG. 1a
FIG. 1b
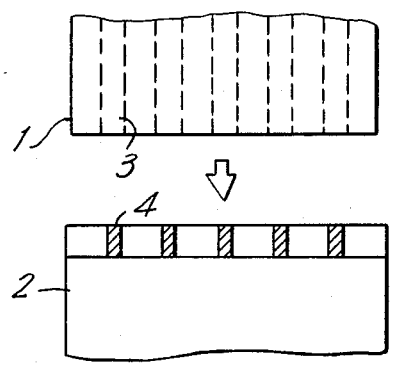
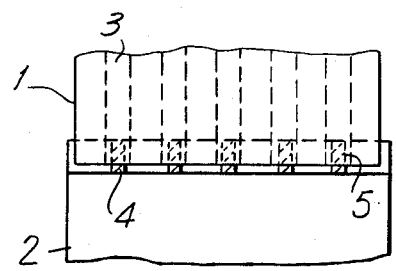

ELECTROLESS PLATED TERMINALS OF DISPLAY PANEL

This is continuation of application Ser. No. 06/486,607, filed Apr. 19, 1983.

BACKGROUND OF THE INVENTION

This invention relates generally to display panels, and more particularly to improved liquid crystal display panels including electroless metal plated terminals, and methods for soldering the display panels to a circuit substrate.

Conventional liquid crystal panels which are driven by low voltages and small currents have been used for display devices such as digital watches, electronic calculators and the like. The display area and display capacitance of liquid crystal panels have been increasing since the time when they were first introduced on the market. At that time, developments in design and manufacture of the driving circuits and system of these devices were less advanced than now. As a result, the number of terminals on a panel was generally small. These terminals were electrically connected to the liquid crystal driving circuit through an electrically conductive rubber.

The present use of liquid crystal panels and devices such as, e.g., personal computers and the like, calls for larger display areas and greater display capacitance than earlier utilized or provided. A larger number of terminals is required in these devices. It is difficult to electrically connect the terminals of these liquid crystal panels with the liquid crystal driving circuit through electrically conductive rubber. A flexible circuit substrate including a series of metal contacts, such as copper, has been employed to overcome this difficulty. The following steps electrically connect a flexible circuit substrate with a liquid crystal panel. The substrate is aligned over the panel and the plastic portion of the substrate and glass portion of the panel are fused by thermocompression bonding. Thereby, the terminals of the liquid crystal panel contact the copper layer of the flexible circuit substrate. The drawbacks of this method include contact failure, especially in liquid crystal panels used in display devices in automobiles, where contact can be poor, in view of the vibrations of a moving car.

Conventional processes for providing terminals on liquid crystal panels call for coating a metal layer over the face of the transparent substrate by well known methods, such as sputtering or deposition. A photoresist is selectively applied and then the metal layer, other than that in the terminal regions, would be etched away, prior to the remaining resist being removed to provide the terminals. Upon the completion of manufacture of a panel, a flux agent is applied to the metal coated terminals and then a solder layer is coated thereon prior to electrically connecting the panel to a substrate. It is necessary to apply flux to the terminals prior to applying the solder and then to remove the flux after soldering. These steps, of course add to the expense and time consumed in manufacture of the panels. Moreover, the use of large display area panels calls for soldering a large quantity of terminals. This is conventionally done by dipping the panel substrate in a solder bath. A drawback to this method is that the substrate tends to break as a result of thermoexpansion. To overcome this problem, it is necessary to heat the substrate to approximately 100° C. before dipping. This is another time-consuming and costly step.

SUMMARY OF THE INVENTION

In order to overcome the above drawbacks, and in accordance with the invention, a transparent, conductive layer of a metallic oxide, such as tin oxide, indium oxide or indium tin oxide, is formed on the transparent substrate. A metallic layer is electroless plated on this oxide layer by directly dipping the liquid crystal panel substrate bearing the oxide layer in an electroless plating solution. The solution selectively plates only the oxide layer. An electroless solder layer can be directly coated onto the metal plated layer at the terminal regions of the liquid crystal panel. Metals such as nickel, copper, cobalt, their alloys and the like are suitable for use as the electroless plated metal layer. A noble metal layer can be electroless plated on the metal layer prior to electroless plating the solder. If the noble metal is plated, there is no need to apply a flux agent to the metal layer. In addition to electroless plating a solder layer, additionally acceptable electroless plated layers include tin and indium plated layers. The solder applied to the terminals on the liquid crystal panel will strengthen the contact between the terminals of the panel and the end portion of a flexible circuit substrate. The use of electroless plated metal and solder layers, with or without the electroless plated noble metal layer, reduces the manufacturing cost of liquid crystal panels.

After forming the first electroless plated metal layer, it is heated under atmospheric condition in order to further improve the adhesivity of the plated layer to the oxide.

Catalytic solutions containing both $SnCl_2$ and $PdCl_2$ have recently been developed and applied. The inventor has discovered that electroless plating on to a metallic oxidized transparent conductive layer on a display panel substrate can be performed with a catalytic solution containing both $SnCl_2$ and $PdCl_2$. The substrate can be glass, quartz, crystal and the like. Electroless plating can not be done directly on such substrate materials. However, it can be done on the metallic oxidized layer. Based on this discovery, this invention realizes the selective electroless plating which can be done by forming patterned metallic oxidized film on the substrate of glass, quartz, crystal and the like and then dipping the substrate in a catalytic solution containing $SnCl_2$ and $PdCl_2$.

In a liquid crystal panel in accordance with this invention, electroless plating is done only on the transparent electrodes, e.g. tin oxide, indium oxide, or indium tin oxide by using, e.g., nickel according to the above-mentioned plating method, and after that, electroless noble metal plating, solder plating, tin plating or indium plating and the like can be applied prior to soldering.

Accordingly, it is an object of the invention to provide an improved liquid crystal panel.

It is another object of the invention to provide improved liquid crystal panel terminals.

It is still another object of the invention to provide a method of manufacturing improved liquid crystal panel terminals.

Yet another object of the invention is to provide display panel terminals which include electroless plated metallic surfaces.

A still further object of the invention is to provide display panels having electroless solder plated terminals.

Still a further object of the invention is to provide a method for soldering the terminals of a display panel to a circuit substrate.

Still other objects and advantages of the invention will in part be obvious and will in part be apparent from the specification.

The invention accordingly comprises the several steps and the relation of one or more of such steps with respect to each of the others, and the articles possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description, taken in connection with the accompanying drawing, in which:

FIG. 1 a-b is an overhead plan view, partially in phantom, illustrating a conventional method of connecting a display panel to a substrate.

DESCRIPTION OF THE PREFERRED EMBODIMENTS

FIG. 1 a-b illustrates a conventional process for bonding a circuit substrate to a display panel. Flexible substrate 1 having a plurality of metal electrodes 3, preferably copper, is bonded to liquid crystal panel 2, at liquid crystal terminals 4. The flexible circuit substrate 1 is placed in contact with liquid crystal panel 2 so that the metal electrodes 3 on the substrate 1 are opposed to the terminals 4 on the liquid crystal panel 2, as shown in FIG. 1b. The flexible circuit substrate material and glass substrate portion of the liquid crystal panel are fused to each other by thermocompression bonding. Thermocompression bonding causes electrodes 3 to contact terminal 4.

The method of manufacture of liquid crystal panels of the invention is as follows. To a transparent substrate of inorganic glass, plastic, ceramic or the like, is applied a transparent conductive layer of metallic oxide, such as tin oxide, indium oxide and the like, by chemical vapor deposition, sputtering or other known deposition techniques. A photosensitive resin is applied to the transparent conductive layer by known processes such as, e.g., spinning, roll coating, dipping and the like. The resin is selectively exposed to light by use of a mask and then the nonselected resin is removed. The transparent conductive layer is selectively dissolved and then the remaining photoresist is removed. The upper and lower substrates of the liquid crystal panel, including the transparent, conductive, metallic oxide electrodes, remain. The substrates are then oriented through the use of orientation compositions such as aminosilanes, polyimides and the like. These compositions are applied to the substrate by known techniques, such as, e.g. printing, dipping, roll coating, spinning and the like. These compositions are then heated and rubbed to orient their axes. A gap sealing substance such as an epoxy resin, containing diffused gap materials therein to properly space the opposed faces of the upper and lower crystal substrates, is printed on both substrates in order to seal them when the cell is prepared. Then a liquid crystal material is encapsulated in the space between the substrates, defined by the sealing substances. The material is introduced into the space through a previous opening in a substrate, which is then sealed. The terminals of the liquid crystal panel are electroless plated with a metal, such as nickel. Thereafter, the terminal portions are electroless plated with solder. A noble metal can be electroless plated onto the metal layer prior to the electroless plating of the solder.

Conventionally, electroless plating requires two pretreatment steps. The first is a sensitizing step and the second is an activating step. Sensitizing refers to the process of immersion in $SnCl_2$ solution to enable an dihydric tin ion to be absorbed on the substrate. Activation refers to a process of immersion in $PdCl_2$ solution, whereby dihydric tin ion reacts with the dihydric palladium ion. Metallic palladium is thereby deposited on the substrate. The palladium acts as a catalyst in electroless plating the substrate.

Lately catalytic solution containing $SnCl_2$ and $PdCl_2$ has been developed and applied to a practical use. The inventor of this invention previously discovered the phenomenon that electroless plating can be done by using the above-mentioned solution containing $SnCl_2$ and $PdCl_2$ after coating metallic oxidized layer (transparent conductive layer) on glass, quartz, crystal and the like, whereas electroless plating cannot be done directly on glass, quartz, crystal and the like. Based on this discovery, this invention realizes the selective electroless plating which can be done by forming patterned metallic oxidized layer on the substrate of glass, quartz, crystal and the like and then dipping the work in the catalytic solution compounding $SnCl_2$ and $PdCl_2$.

Preferably, the thickness of the layer of nickel, copper, cobalt and the like, deposited by electroless plating is between 500 Å and 5 $\mu$m, and preferably about 500 Å and 0.81 $\mu$m as shown in the following examples. When the layer is under 500 Å thick, the plated layer such as nickel is attacked by solder, and thus enough adhension strength cannot be attained. When the layer is above 5 $\mu$m, internal stressing of the layer becomes relatively large and insufficient adhesive strength is attained.

Further, it is even more preferred that the thickness of the plated layer is between 1000 Å and 20 $\mu$m, for electroless solder plating, electroless tin plating, electroless indium plating and the like. When the thickness is under 1000 Å, solderability decreases, and when it is above 20 $\mu$m, it takes a longer time for plating and the cost is increased. Still further, a thickness between 2000 Å and 10 $\mu$m is most desirable because of its solderability and cost.

Solder is coated on the electroless plated terminals of the liquid crystal panel by using a soldering bit or immersing in a solder bath or by, preferably, electroless plating. A flux agent is first applied to the part of the terminals to be soldered. The thickness of the solder layer is from 0.1 $\mu$m to 300 $\mu$m. An adhered solder layer of thickness less than 0.1 $\mu$m does not have sufficient bonding strength and an adhered solder layer of thickness greater than 300 $\mu$m easily causes short-circuiting at the adjoining terminals of the liquid crystal panel, because of the presence of too much soldering material, particularly when the liquid crystal panel is soldered into a flexible circuit substrate. The thickness of the solder layer varies somewhat according to the space between the terminal electrodes, thus the coating is not always limited to from 0.1 $\mu$m to 300 $\mu$m, as mentioned above.

A flux agent is not required if layer of noble metal is electroless plated on the metal layer before the solder layer is applied. This is because the noble metal layer imparts good wetting properties to the solder on the noble metal. The thickness of the adhered noble metal is preferable from 50 Å to 1 μm. The plated layer of noble metal does not require a thickness over 50 Å for improving the wetting property of solder. It would become too expensive to plate the noble metal to a depth greater than 1 μm.

After forming the first electroless plated metal layer, it is heated under atmospheric condition in order to further improve the adhesivity of the plated layer to the oxide. Temperatures up to 400° C. are desirable, but it must be within the heat-resistance temperature of the liquid crystal panel. A short heating time is desirable so as not to adversely affect the properties of the liquid crystal panel. When the temperature is under 80° C. or the heating time is less than 5 minutes, adhesivity of metal plating layer is not improved. Preferably, it is desirable that the temperature is between 80° C. and 150° C. and the heating time is between 5 minutes and 5 hours.

EXAMPLE 1

A liquid crystal panel including a patterned transparent, conductive layer on a metal oxide was degreased with 5% NaOH solution, and neutralized by rinsing in distilled water. The panel was dipped in a HS-101B sensitizer, manufactured by Hitachi Kasei Kogyo, for two minutes and rinsed in clean water.

It was next dipped in 1N-NaOH solution for one minute and rinsed in clean water and dipped in an electroless plating nickel bath at 45° C.; S-680, manufactured by Kanigen Co., LTD. (S-680 is a mixed solution of 20 g/lit. $NiSO_4$; 25 g/lit. $NaH_2PO_2$; 30 g/liter of complexing agent of sodium malate, sodium acetate and sodium citrate and 15 g/lit. $(NH_4)_2SO_4$ buffer agent). The panel was dipped in the electroless bath for seven minutes. A nickel plating layer of 3600 Å thickness was deposited on the terminals of the panel.

The nickel plated panel was next dipped in an electroless plating tin bath (LT-27, manufactured by Shipley Co., Ltd.) at a temperature of 70° C. A 4500 Å thick tin layer was deposited on the nickel layer. This tin layer functions as a brazing agent. The panel was next heated at 120° C. for one hour and connected to the conductive portion of a flexible circuit substrate formed on a polyimide tape as follows. A solder layer ten microns thick is formed on top of the circuit substrate, where it will contact the electroless plated terminals. The terminals of the liquid crystal panel and the end portion of the circuit substrate on which the solder layer was formed are attached and soldered by a metal tool at a pressure of 2 Kg/cm pressure. The flexible circuit was then forcibly separated from the display panel. The separation occurred between the nickel layer and the conductive portion of the flexible circuit substrate. Thus, it was found that adhesivity strength between the panel and the circuit substrate depends on the adhesivity of the nickel plating. Adhesivity strenth between the liquid crystal panel formed according to the methods of this example and the circuit substrate is 1.0 Kg/cm, which is applicable to practical use. LT-27 includes 100 cc/L of a mixture of 10% HCl and 10% $H_2SO_4$; 150 cc/L 25% $SnCl_2$ and 750 cc/L distilled water.

EXAMPLE 2

A liquid crystal panel in accordance with this invention, as in Example 1 is soldered to a conductive portion of a circuit substrate formed on a polyester film in the same method as that described in Example 1. The circuit substrate, having a solder layer of 15 μm thickness is commercially purchased. Adhesivity strength between the panel and the circuit was found to be substantially equal to that of Example 1.

EXAMPLE 3

Electroless plating of nickel and tin was undertaken on the terminals of a liquid crystal panel in the same manner as described in Example 1. The liquid crystal panel was then dipped in an electroless soldering plating bath (SP-64-EL manufactured by Kojundo Kagaku Kenkyusho Co., Ltd.) at 60° C. for 15 minutes, whereby a solder plating layer of 2500 Å thickness was formed. After heating the liquid crystal panel at 120° C. for an hour, it was soldered in the same manner as in Example 1 to the conductive portion of a circuit substrate formed on polyimide tape (having soldering layer of 20 μm on the top). Adhesivity strength between the liquid crystal panel and the circuit substrate attained in accordance with this method is 1.1 Kg/cm, which can be utilized in practical applications. SP-64-EL includes 30 g/L $SnCl_2$; 19 g/L lead acetate; 5 cc/L HCl; 10 g/L boric acid; 7 g/L potassium carbonate.

EXAMPLE 4

A liquid crystal panel, as in Example 3, is soldered to a conductive portion of a circuit substrate (as in Example 3, with a solder layer of 10 μm thickness on the top), whereby the same adhesivity as that of Example 3 was attained.

EXAMPLE 5

An electroless copper plating layer of 4500 Å thickness was formed on the terminals of a liquid crystal panel according to the method of Example 1, using MK-430 electroless copper plating bath by Muromachi Kagaku Co., Ltd. An indium layer 2500 Å thick was then formed on the electroless copper plating layer, for soldering purposes, by using an indium electroless plating solution (In-600 manufactured by Kojundo Kagaku Kenkyusho Co., Ltd.). The liquid crystal panel was heated at 120° C. for an hour. It was then soldered to substrate circuit terminals (having a solder layer of 15 μm thickness on the top) formed on paper phenol. The terminals of the liquid crystal panel and an end portion of the circuit substrate were attached and soldered by 2 Kg/cm pressure for 4 seconds by means of a metal tool. Adhesivity strength between the liquid crystal panel, according to the above-mentioned method, and the circuit substrate is 1.1 Kg/cm, which is applicable to practical use. MK-430 includes 0.3 g/L $CuSO_4$; 1 percent formalin; 15 g/L NaOH; 30 g/L Rochelle Salt, EDTA. In600 includes 40 g/L potassium cyanide and 30 g/L indium sulfate.

EXAMPLE 6

The nickel plated panel of Example 1 is treated as follows.

The nickel plated terminals of the liquid crystal panel are heated at a temperature of 120° C. for an hour. The terminals are then soldered into an electrically conductive portion of a metallic layer of a flexible circuit substrate, which is formed on polyimide tape. The soldering process is as follows: first a flux agent for nickel metal is applied to the surface of the terminals of the liquid crystal panel. The liquid crystal panel is dipped in a solder bath at a temperature of 250° C. for 4 seconds, so that a solder layer of 25 μm thick is coated on the surface of the terminals. The terminals of the liquid crystal panel and the end portion of a circuit substrate on which a solder layer of 10 μm thickness is formed on the upper layer are attached and soldered by 2 Kg/cm pressure by means of a metal tool. A test to separate the flexible circuit substrate from the display panel was undertaken and the separation occurred between the nickel layer and the conductive portion. Thus, it was found that adhesivity strength depends on the adhesivity of the nickel plating layer to conductive portion. Adhesivity strength between the liquid crystal panel formed according to the above-mentioned method and the circuit substrate is 1.0 Kg/cm, which is applicable to practical use.

EXAMPLE 7

A display panel having terminals with an electroless plated layer of nickel 500 Å thick is prepared according to the method of Example 1. A solder layer 20 μm thick is coated on the terminals by dipping the panel into a solder bath. The terminals are soldered to the end portion of a flexible circuit substrate formed on a polyester tape, on which a solder layer 10 μm thick is formed on the terminals. The obtained adhesivity strength at the junction of liquid crystal panel and flexible circuit substrate is the same as that in Example 6.

EXAMPLE 8

The nickel plated terminals (having a plated metal layer of 3600 Å thick) of a liquid crystal panel prepared in the same manner as that in Example 1 are immersed in an electroless gold plating bath (Atomex gold plating bath manufactured by NIPPON ENGELHARD Ltd.) at a temperature of 60° C. for ten minutes, so that a gold layer of 400 Å thick is deposited on the nickel terminal layer. A solder layer 60 μm thick is then coated on the terminals of the liquid crystal panel. After heat treatment at a temperature of 120° C., the terminals of the liquid crystal panel are soldered to the end portion of a flexible circuit substrate formed on polyimide tape, and having a solder layer of 10 μm thick previously coated on the end portion of flexible circuit substrate. The obtained adhesivity strength at the junction of the liquid crystal panel and flexible circuit substrate is 1.4 Kg/cm, which is sufficiently strong for practical use. Atomex bath includes 5 g/L potassium gold cyanide and 20 g/L carboxylic acid and/or carboxylate group.

EXAMPLE 9

A liquid crystal panel, which was previously electrolessplated with nickel in the same manner as in Example 1 is immersed in an electroless copper plating bath (MK-430 manufactured by Muromach Kagaku Company) for six minutes, so that a copper layer of 3000 Å thick is plated on the terminals of the liquid crystal panel. After heating the liquid crystal panel at a temperature of 120° C. for an hour, the terminals of the liquid crystal panel are soldered to the end portion of a flexible circuit substrate made of paper phenol. A solder layer 15 μm thick was previously coated on the end portion of the flexible circuit substrate and a solder layer of 50 μm thick was coated on the terminals of the liquid crystal panel by using a soldering bit after applying flux agent to the part to be soldered. The flexible circuit substrate and the liquid crystal panel were soldered together by using a high-frequency heater. The obtained adhesivity strength at the junction of the liquid crystal panel and the flexible circuit substrate was 1 Kg/cm.

EXAMPLE 10

A nickel layer 4000 Å thick was plated on the terminals of a liquid crystal panel by electroless plating, as in Example 1. The panel is heated at a temperature of 120° C. for an hour. A flux agent is applied to the part to be soldered, which is then immersed in a tin bath at a temperature of 300° C. for five seconds. A tin layer 40 μm thick, which serves as soldering material, is deposited from the tin bath on to the terminals of the liquied crystal panel. The liquid crystal panel is heated at a temperature of 100° C. for five hours. Ther terminals of the liquid crystal panel and the end portion of a flexible circuit substrate having a solder layer 15 μm thick previously coated on its end portion are soldered together by applying 3 Kg/cm pressure and heating the part to be soldered for 2 seconds, using a metal tool at a temperature of 350° C. The obtained adhesivity strength at the junction of liquid crystal panel and circuit substrate is 1.7 kg/cm, which is sufficiently strong for practical use of the liquid crystal panel.

It will thus be seen that the objects set forth above, among those made apparent from the preceding description, are efficiently attained and, since certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A display panel, comprising a transparent substrate, transparent, conductive, patterned metallic electrodes including display terminal portions disposed on a surface of said substrate and an electroless plated metal layer on the display terminal portions and a circuit substrate having circuit electrode terminal portions for electrical connection to the display terminal portions, said metal layer on the display terminal portions being plated to a thickness of about 500 Å to about 8100 Å and wherein the electroless plated metal layer and the terminal portions of the circuit terminal portions are connected by soldering.

2. A display panel described in claim 1, wherein the electrodes comprise a transparent conductive metallic electrode selected from the group consisting of indium oxide, tin oxide and indium tin oxide.

3. A display panel as described in claim 1, wherein the metal layer is selected from the group consisting on nickel, copper and cobalt.

4. A display panel described in claim 3, further comprising an electroless solder layer plated on the metal layer.

5. A display panel as described in claim 4, wherein the solder layer is plated to a thickness of from about 1000 Å to about 20 μm.

6. A display panel as described in claim 3, wherein an electroless noble metal layer is plated to a thickness of between about 50 Å and about 1 μm on the metal layer and an electroless solder layer is plated to a thickness or from about 1000 Å to about 20 μm on the noble metal layer.

7. A display panel as described in claim 6, wherein the noble metal comprise gold.

8. A method of manufacturing a display panel comprising providing a transparent substrate, transparent, conductive, patterned metallic electrodes including display terminal portions selectively disposed thereon and placing said substrate in an electroless metal plating bath to selectively plate a metal layer on to the transparent, conductive layer display terminal portions, said metal layer on the display terminal portions being plated to a thickness of about 500 Å to 8100 Å and further comprising providing a circuit substrate having circuit electrode terminal portions for electrical connnection to the display terminal portions and connecting the electroless plated metal layer and the terminal portions of the circuit terminal portions by soldering.

9. A method as described in claim 8 wherein the electrodes comprise a metallic oxidized layer selected from the group consisting of tin oxide, indium oxide, indium tin oxide.

10. A method as described in claim 8, wherein the metal layer comprises a metal selected from the group consisting of nickel, copper and cobalt.

11. A method as described in claim 10 further comprising electroless plating a layer of from about 1000 Å to about 20 μm thickness of solder, onto the electroless plated metal layer.

12. A method as described in claim 10 further comprising electroless plating a noble metal layer of between about 50 Å and 1 μm thickness on to the metal layer and then electroless plating a layer of from about 1000 Å to about 20 μm thickness of solder onto the noble metal layer.

13. A method as described in claim 12, wherein the noble metal comprises gold.

14. A method as described in claim 8, wherein said metal layer is nickel and further comprising heat treating the nickel layer at a temperature of from about 80° C. to about 150° C. for a period of from 8 minutes to 5 hours.

15. A method of soldering a display panel including a transparent substrate and transparent, conductive, patterned metallic electrodes including display terminal portions selectively disposed thereon to a circuit substrate, comprising electroless plating a metal layer of from about 500 Å to about 50,000 Å thickness on to the display terminal portions, electroless plating a layer of solder of from about 1000 Å to about 200,000 Å thickness on to said metal layer, plating a layer of solder on to the end portion of an upper surface of the circuit substrate and compression soldering the transparent substrate to the circuit substrate.

16. A method as described in claim 15, wherein the electroless plated metal layer is selected from nickel, copper and cobalt.

17. A method as described in claim 15, wherein the electrodes comprise a matellic oxidized layer selected from tin oxide, indium oxide and indium tin oxide.

18. A method as described in claim 15, further comprising electroless plating a noble metal layer of from about 50 Å to about 1 μm thickness on to said metal layer prior to solder plating.

19. A method of soldering a display panel including a transparent substrate and transparent, conductive, patterned metallic electrodes including display terminal portions selectively disposed thereon to a circuit substrate, comprising electroless plating a metal layer of from about 500 Å to about 50,000 Å thickness on to the display terminal portions, electroless plating a noble metal layer of from about 50 Å to 10,000 Å thickness on to said metal layer, plating a solder layer on to the end portion of an upper surface of the circuit substrate and soldering the transparent substrate to the circuit substrate.

20. A method as described in claim 19, wherein the electroless plated metal layer is selected from nickel, copper and cobalt.

21. A method as described in claim 19, wherein the electrodes comprise a metallic oxidized layer selected from the group consisting of tin oxide, indium oxide and indium tin oxide.

22. A method of manufacturing a display panel comprising providing a transparent substrate, transparent, conductive, patterned metallic electrodes including display terminal portions selectively disposed thereon, placing said substrate in an electroless metal plating bath to selectively plate a metal layer to a thickness of from about 500 Å to 8100 Å on to the display terminal portions, coating a solder layer on said metal layer by dipping in a solder bath or using a soldering bit and further comprising providing a circuit substrate having circuit electrode terminal portions for electrical connection to the display terminal portions and connecting the electroless plated metal layer and the terminal portions of the circuit terminal portions by soldering.

* * * * *